United States Patent [19]
Cho

[11] Patent Number: 5,834,978
[45] Date of Patent: Nov. 10, 1998

[54] APPARATUS FOR PROTECTING POWER AMP MODULE

[75] Inventor: Gyou-Il Cho, Seoul, Rep. of Korea

[73] Assignee: SamSung Electronics Co., Ltd., Suwon, Rep. of Korea

[21] Appl. No.: 774,706

[22] Filed: Dec. 23, 1996

[30] Foreign Application Priority Data

Dec. 23, 1995 [KR] Rep. of Korea .................. 1995/55747

[51] Int. Cl.[6] ...................................... H03F 1/52
[52] U.S. Cl. ...................... 330/298; 330/207 P; 455/117
[58] Field of Search .............................. 330/207 P, 298; 361/87, 98; 455/117

[56] References Cited

U.S. PATENT DOCUMENTS

| | | |
|---|---|---|
| 4,427,951 | 1/1984 | Amada et al. . |
| 4,878,034 | 10/1989 | Gross et al. ............................ 330/298 |
| 5,128,629 | 7/1992 | Trinh . |
| 5,365,201 | 11/1994 | Shih et al. . |

*Primary Examiner*—James B. Mullins
*Attorney, Agent, or Firm*—Robert E. Bushnell, Esq.

[57] ABSTRACT

A power amp module protecting apparatus of a mobile wireless phone having: a power supply unit for supplying driving power to a power amp module; a switching unit, connected between the power supply unit and an overcurrent detector, for performing a switching action in accordance with a logic level of a switching control signal output from a controller and a logic level of an overcurrent detecting signal from the overcurrent detector; the overcurrent detector, connected between the switching unit and the power amp module, for outputting an overcurrent detecting signal having a high logic level in response to the detection of an overcurrent from the power supply unit; and the controller for outputting the switching control signal to switch on the switching unit when no overcurrent is detected, for maintaining the switching unit in an off state in response continued receipt of the overcurrent detecting signal of high logic level output from the overcurrent detector and outputting the switching control signal to switch on the switching unit, from a switched-off state, within a predetermined time.

10 Claims, 2 Drawing Sheets

APPARATUS FOR PROTECTING POWER AMP MODULE

CLAIM OF PRIORITY

This application makes reference to, incorporates the same herein, and claims all benefits accruing under 35 U.S.C §119 from an application entitled Apparatus For Protecting Power Amp Module earlier filed in the Korean Industrial Property Office on 23 Dec. 1995, and there duly assigned Ser. No. 55747/1995 by that Office.

BACKGROUND OF THE INVENTION

1. Field of the Invention

The present invention relates to a mobile wireless phone, and more particularly to an apparatus for protecting a power amp module (hereinafter called PAM) of a mobile wireless phone from overcurrent.

2. Description of the Related Art

In general, to transmit an RF signal in a cellular phone, the RF signals should be amplified beyond a particular output and a PAM (power amp module) is used to amplifying the RF signal, see for example, U.S. Pat. No. 5,128,629 to Lanh T. Trinh, and entitled Method For Controlling The Output Power Of Digital Cellular Telephones. However, when overcurrent is applied to the PAM being in use, the PAM cam become damaged. Thus, to prevent such a damage an overcurrent detecting circuit is connected between a driving power supply unit (hereinafter, referred to as power supply) and the PAM.

One example of a known protection circuit for protecting a power amplifier from excessive current, or overcurrent, is shown in U.S. Pat. No. 4,427,951 to Nobutaka Amada, et al., entitled Protective Device For Power Amplifier, in which a detector is provided to detect at the output of the amplifier, the DC output voltage or excessive current from the amplifier and upon such detection, cuts of the source of power to the amplifier. The power amplifier in the aforementioned patent is therefore subject to damage since any applied overcurrent is not detected until after it has been applied to the power amplifier.

In U.S. Pat. No. 5,365,201 to Kelvin Shih, et al., entitled Power Supply Interruption Circuit For An Audio Power Amplifier, which utilizes a transistor, serving as a comparator to detect excessive current. When excessive current is detected, a light emitting diode is turned on and a circuit utilizing a phototransistor, responsive to the light emitted by the light emitting diode, disables a voltage regulator to cut off power to the power amplifier. Should the light emitting diode fail, however, then the power amplifier would no longer be protected from excessive current.

SUMMARY OF THE INVENTION

To overcome the above problem, it is an object of the present invention to provide a power amp module (PAM) protecting apparatus for drastically reducing a peak value of overcurrent applied to the PAM during the overcurrent detection.

Another object is to provide an apparatus for protecting the PAM from an overcurrent which overcomes the problems associated with the prior art, for use in a cellular or mobile telephone apparatus.

Accordingly, to achieve the above objects, there is provided a power amp module protecting apparatus comprising a source for supplying driving power to the power amp module, an on/off switching circuit connected between the power supply means and an overcurrent detecting circuit, for performing a on/off switching action in accordance with a logic level of a switching control signal output from a controller means and the overcurrent detecting circuit, an overcurrent detecting circuit, connected between the switching means and the power amp module, for outputting an overcurrent detecting signal in response to the flow-in of overcurrent from the power supply source; and a controller for outputting the switching control signal to switch off the switching circuit in response to the overcurrent detecting signal of a particular logic level output from the overcurrent detecting circuit and outputting the switching control signal to switch on the switching circuit within a regulated time.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
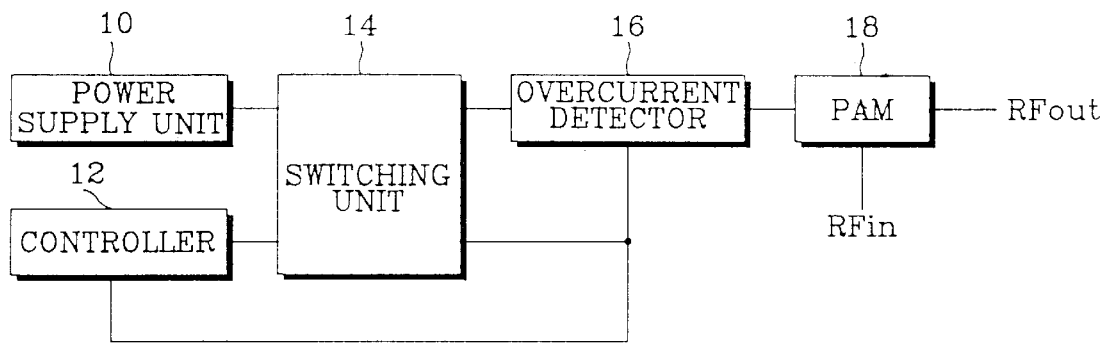
FIG. 1 is a block diagram showing a structure of an apparatus for protecting a power amp module from overcurrent according to the principles of the present invention.

FIG. 1 shows a structure of a system for protecting a power amp module (PAM) due to overcurrent. In FIG. 1, the system includes a power supply unit 10 for supplying power to each unit of the present system, a switching unit 14 connected between the power supply unit 10 and an overcurrent detector 16 and for supplying the power supplied from the power supply unit 10 to a PAM 18 by being switched on under control of a controller 12 and overcurrent detector 16 connected between switching unit 14 and PAM 18. Overcurrent detector 16 outputs an overcurrent detecting signal having a particular logic state in respond to the supply of overcurrent through switching unit 14, and controller 12, having a control program for controlling respective units of the present system, outputs a switching control signal having a particular logic state to switch off switching unit 14 in response to the overcurrent detecting signal from overcurrent detector 16. PAM 18 amplifies an input signal $RF_{in}$ to output an amplified signal $RF_{out}$ by a driving power supplied via power supply unit 10, switching unit 14 and overcurrent detector 16.

Figure 2:
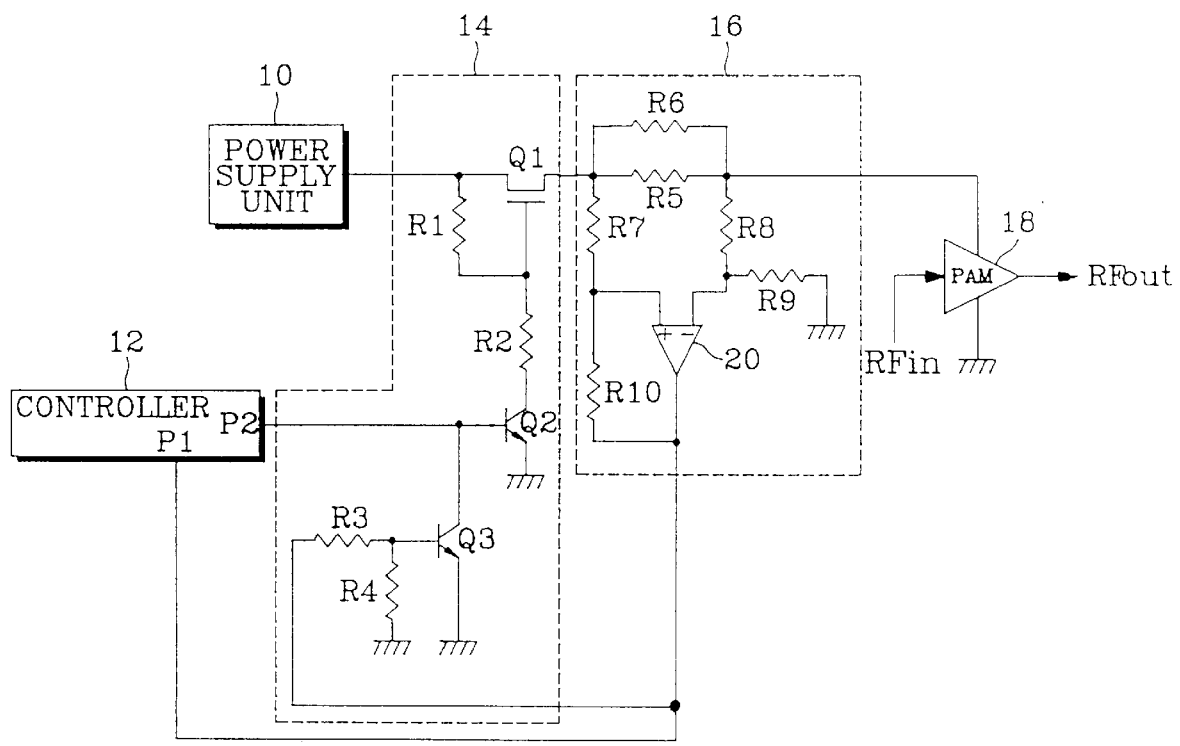
FIG. 2 is a detailed circuit diagram of the apparatus of FIG. 1 according to the principles of the present invention.

FIG. 2 shows a detailed circuit diagram of the apparatus shown in FIG. 1. Referring to FIG. 2, the configuration of a PAM protecting apparatus of the present invention will now be described in detail. First, switching unit 14 includes a field effect transistor Q1 having a source connected to an output port of power supply unit 10 and a gate connected to the output port of power supply unit 10 via a resistor R1. The gate of transistor Q1 is further connected to a collector of transistor Q2 via a resistor R2. Resistors R1 and R2 are connected in series between the output port of power supply unit 10 and the collector of transistor Q2. A drain of transistor Q1 provides the power supplied by power supply unit 10 to overcurrent detector 16. Transistor Q2 has an emitter connected to a ground terminal and a base connected to an output port P2 of controller P2 for performing an on/off switching action in accordance with a logic level of a switching control signal applied from port P2 of controller 12. A transistor Q3 has a collector connected to the base of transistor Q2, an emitter connected to the ground terminal and a base connected to an output of overcurrent detector 16 via a resistor R3 for performing an on/off switching action in accordance with a logic level of an overcurrent detecting signal. A resistor R4 is also connected between the base of transistor Q3 and the ground terminal.

Overcurrent detector 16 comprises resistors R5–R10 and a differential amplifier 20. The output port of differential amplifier 20 is connected in common to resistor R3 of switching unit 14 and to an input port P1 of controller 12. Resistors R5 and R6 of overcurrent detector 16 are connected in parallel between the drain of transistor Q1 and PAM 18, resistor R7 is connected between the drain of transistor Q1 and a noninverting input terminal of differential amplifier 20. Resistor R10 is connected between the output terminal and the noninverting input terminal of differential amplifier 20. Resistor R8 is connected between resistor R5 and an inverting input terminal of differential amplifier 20. Resistor R9 is connected between the inverting input terminal of differential amplifier 20 and the ground terminal. The values of resistors R7–R10 are set such that the logic level of the overcurrent detecting signal output from the output terminal of differential amplifier 20 will have a low logic level when there is no overcurrent output from power supply unit 10.

The operation of the power amp module protecting apparatus will be described in detail with reference to FIG. 2. To transmit an RF signal controller 12 outputs, from port P2, a switching control signal having a high logic level which is applied to the base of transistor Q2. Accordingly, a low logic level is applied to the gate of the transistor Q1 turning transistor Q1 on. Thus, driving power having a predetermined level 8 is output from power supply unit 10 and is normally supplied to PAM 18. Here, overcurrent detector 16 operates as follows.

Figure 3:
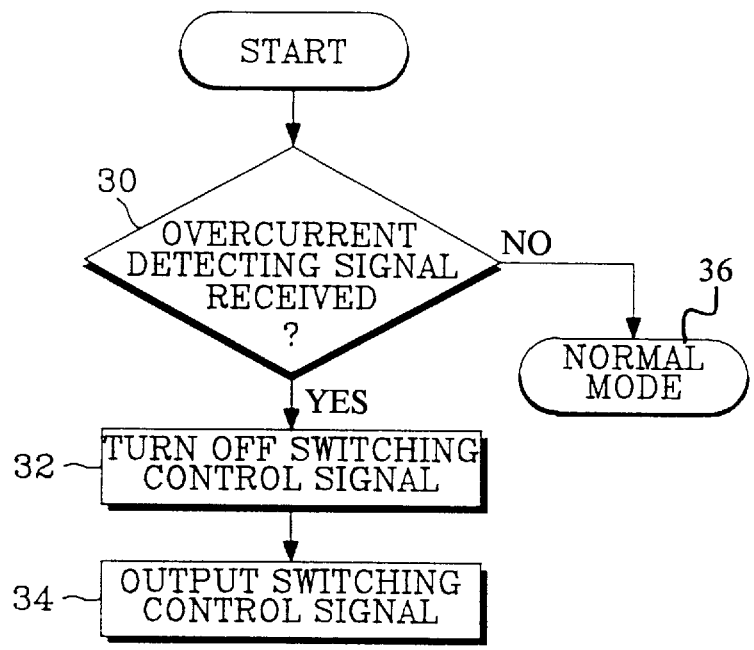
FIG. 3 is a flow chart for explaining a controller for protecting the power amp module during overcurrent detection according to the principles of the present invention.

According to FIGS. 2 and 3, under normal operations, i.e., when the driving power having a predetermined level is supplied from power supply unit 10, the output terminal of differential amplifier 20 will have a low logic level. That is, the voltage applied to the inverting input terminal of differential amplifier 20 will be greater than the voltage applied to the noninverting input terminal of differential amplifier 20. Then, when overcurrent flows in from the power supply unit 10 due to malfunction or a change of device characteristic, differential amplifier 20 outputs an overcurrent detecting signal as a logic level value of a high logic level. At this time, the high logic level value output from the output terminal of differential amplifier 20 is applied to the base of transistor Q3 via resistor R3 to turn on transistor Q3 and is applied to input port P1 of controller 12. A low logic level at the base of transistor Q2 turns transistor Q2 off, which then turns transistor Q1 off and stops the power from being applied to PAM 18. Controller 12 checks for input of the overcurrent detecting signal, step 30, at port P1 and turns off the switching control signal, step 32, when the overcurrent detecting signal of high logic level is received. Accordingly, the output from port P2 of controller 12 will have a low logic level value. When no overcurrent detecting signal having a high logic level is received at port P1, controller 12 outputs a switching control signal having a high logic level and switching unit 14 is switched on such that the output of power supply unit 10 is provided to PAM 18. In step 34, controller 12 will again output a switching control signal having a high logic level when a supervisory audio tone, as is known in the art, is transmitted to a base station within six seconds in order to maintain communication, and controller 12 will again check for a overcurrent detecting signal having a high logic level. Meanwhile, when overcurrent is continuously generated, switching unit 14 continuously maintains the switching-off state by the overcurrent detecting signal having a high logic level output from differential amplifier 20, steps 30 and 32.

Figure 4:
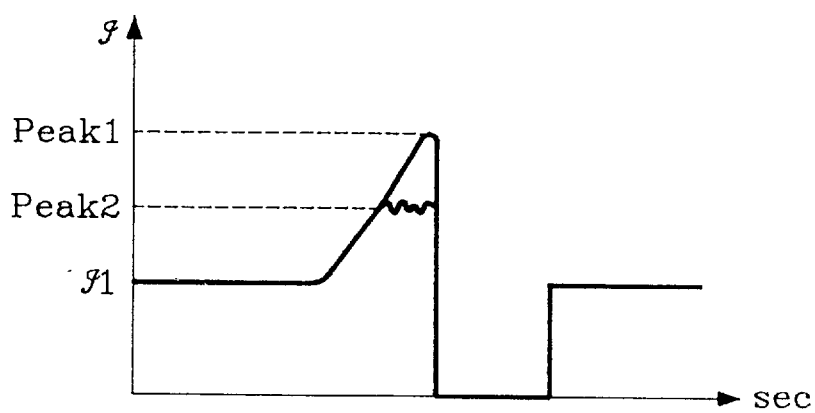
FIG. 4 is a graph indicating the characteristics of the respective overcurrent according to a conventional technology and the present invention.

FIG. 4 is an overcurrent characteristic graph showing the comparison result of a Peak 1 of overcurrents applied to the PAM 18 during the operation of a circuit not having a power amp module protecting apparatus and a Peak 2 of overcurrents applied to PAM 18 during the operation of a circuit having the power amp module protecting apparatus according to the principles of the present invention. The controller of a power amp module protecting apparatus not having the power amp module protecting apparatus of the present invention blocks the driving power being supplied to the power amp module by switching off the power supply unit in response to detection of an overcurrent. In such a case, it takes a few milliseconds (msec) from a point when the overcurrent is first detected to a point when the switching off occurs, and accordingly, the peak value of the overcurrent applied to the power amp module becomes a value of Peak 1 due to the delay in switching of the power.

In the meantime, in the power amp module protecting apparatus of the present invention, when overcurrent flows in from the power supply unit 10 due to malfunction and/or a device characteristic change, switching unit 14 is switched off according to the overcurrent detecting signal of a high logic level output from differential amplifier 20, thereby blocking the driving power being supplied to PAM 18 within a few nanoseconds (nsec) from a point when the overcurrent is detected to a point when the switching unit 14 is turned off, and accordingly, the peak value of the overcurrent applied to PAM 18 becomes a value of Peak 2. That is, the peak value of overcurrent applied to is PAM 18 can be reduced by curtailing the time from the overcurrent detecting point to the point where the power is turned off.

As described above, in the present invention, the peak value of overcurrent applied to the power amp module is reduced by directly switching off the switching unit when overcurrent is detected, so that the damage to the power amp module can be prevented and communication can continue by switching off the switching unit without break of communication.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A power amp module protecting apparatus of a mobile wireless phone comprising:

means for supplying driving power for a power amp module;

a controller for generating a switching control signal;

switching means responsive to said switching control signal for passing said driving power to said power amp module;

overcurrent detecting means, connected between said switching means and said power amp module, for detecting overcurrent supplied by said means for supplying driving power, said overcurrent detecting means generating a high level detecting signal in response to detection of said overcurrent;

said switching means stopping the passing of said driving power to said power amp module in response to said high level detecting signal; and said controller stopping the generation of said switching control signal in response to said high level detecting signal.

2. The apparatus as set forth in claim 1, said controller regenerating said switching control signal within a predetermined time period.

3. The apparatus as set forth in claim 1, said controller regenerating said switching control signal within a predetermined time period after transmission of a supervisory audio tone from a base station of said mobile wireless phone.

4. The apparatus as set forth in claim 1, said switching means comprising:

a first switching transistor having a source connected to receive said driving power supplied by said means for supplying driving power for a power amp module, a drain for providing said driving power to said power amp module via said overcurrent detecting means, and a gate;

a first resistor connected at a first node to said source and at a second node to said gate;

a second resistor connected between said second node and a collector of a second switching transistor;

an emitter of said second switching transistor being connected to a ground terminal;

a base of said second switching transistor connected at a third node to receive said switching control signal from said controller;

a third switching transistor having a collector connected to said third node, an emitter connected to said ground terminal and a base connected to a third resistor at a forth node, said third resistor being connected between said fourth node and said overcurrent detecting means; and a fourth resistor connected between said fourth node and said ground terminal.

5. The apparatus as set forth in claim 1, said overcurrent detecting means comprising:

a first resistor and a second resistor connected in parallel between a first node and a second node, said first node being connected to receive said driving power passed by said switching means, said second node being connected to said power amp module;

a third resistor connected between said first node and an noninverting input terminal of a comparing means;

a fourth resistor connected between said second node and a third node;

a fifth resistor connected between said third node and a ground terminal;

an inverting input terminal of said comparing means being connected to said third node; and a sixth resistor connected between said noninverting input terminal and an output terminal of said comparing means, said output terminal of said comparing means being further connected to provide said high level detecting signal to said controller and said switching means.

6. The apparatus as set forth in claim 5, said comparing means outputting said high level detecting signal when a voltage at said inverting input terminal is greater than a voltage at said noninverting input terminal.

7. The apparatus as set forth in claim 4, said overcurrent detecting means comprising:

a fifth resistor and a sixth resistor connected in parallel between a fifth node and a sixth node, said fifth node being connected to said drain of said first switching transistor and said sixth node being connected to said power amp module;

a seventh resistor connected between said fifth node and an noninverting input terminal of a comparing means;

an eighth resistor connected between said sixth node and a seventh node;

a ninth resistor connected between said seventh node and said ground terminal;

an inverting input terminal of said comparing means being connected to said seventh node; and a tenth resistor connected between said noninverting input terminal and an output terminal of said comparing means, said output terminal of said comparing means being further connected to provide said high level detecting signal to said controller and said base of said third switching transistor via said third resistor.

8. The apparatus as set forth in claim 7, said comparing means outputting said high level detecting signal when a voltage at said inverting input terminal is greater than a voltage at said noninverting input terminal.

9. The apparatus as set forth in claim 4, said first switching transistor comprising a field effect transistor.

10. A method for protecting a power amp module from overcurrent in a mobile wireless phone, said method comprising the steps of:

generating a first control signal;

controlling a switching unit in response to said first control signal for passing a drive signal to said power amp module;

detecting an overcurrent in said drive signal passed by said switching unit;

directly turning off said switching unit to prevent passing said drive signal to said power amp module in response to detection of said overcurrent;

stopping said step of generating said first control signal when said overcurrent is detected;

regenerating, after said stopping step, said first control signal after a predetermined period of time.

* * * * *